US007120072B2

(12) United States Patent
Ye et al.

(10) Patent No.: US 7,120,072 B2
(45) Date of Patent: Oct. 10, 2006

(54) TWO TRANSISTOR GAIN CELL, METHOD, AND SYSTEM

(75) Inventors: Yibin Ye, Portland, OR (US); Dinesh Somasekhar, Portland, OR (US); Muhammad M Khellah, Tigard, OR (US); Fabrice Paillet, Hillsboro, OR (US); Stephen H Tang, Pleasanton, CA (US); Ali Keshavarzi, Portland, OR (US); Shih-Lien L Lu, Portland, OR (US); Vivek K De, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 188 days.

(21) Appl. No.: 10/881,001

(22) Filed: Jun. 30, 2004

(65) Prior Publication Data

US 2006/0002211 A1 Jan. 5, 2006

(51) Int. Cl.
*G11C 7/00* (2006.01)

(52) U.S. Cl. .................................. 365/203; 365/189.11

(58) Field of Classification Search ................ 365/203, 365/189.11
See application file for complete search history.

(56) References Cited

U.S. PATENT DOCUMENTS

| 5,122,986 A * | 6/1992 | Lim ....................... 365/189.11 |
| 6,072,713 A * | 6/2000 | McKenny et al. ........... 365/150 |
| 6,903,990 B1 * | 6/2005 | Mizugaki ..................... 365/222 |
| 2004/0072583 A1 * | 4/2004 | Weng ....................... 455/456.3 |

OTHER PUBLICATIONS

Ikeda, N., et al., "A Novel Logic Compatible Gain Cell with two Transistors and one Capacitor", *Symposium on VLSI Technology Digest of Technical Papers*, (2000), 168-169.

* cited by examiner

*Primary Examiner*—Michael Tran
(74) *Attorney, Agent, or Firm*—LeMoine Patent Services, PLLC

(57) ABSTRACT

A two transistor memory cell includes a write transistor and a read transistor. When reading the memory cell, the read transistor is turned on, and a voltage develops on a read bit line.

25 Claims, 7 Drawing Sheets

TWO TRANSISTOR GAIN CELL, METHOD, AND SYSTEM

FIELD

The present invention relates generally to memory circuits, and more specifically to memory circuits with two transistor gain cells.

BACKGROUND

Two transistor gain cells typically store a charge on a storage node between the two transistors in the cell. The amount of charge represents digital data, which is typically described as a "1" or "0." The digital data is "read" from the gain cell by allowing a voltage to develop on a circuit node, where the developed voltage depends on the stored charge. In general, it is easier to differentiate between a stored "1" or "0" when a large difference exists between the developed voltage for a "0" and the developed voltage for a "1."

DESCRIPTION OF EMBODIMENTS

Figure 1:
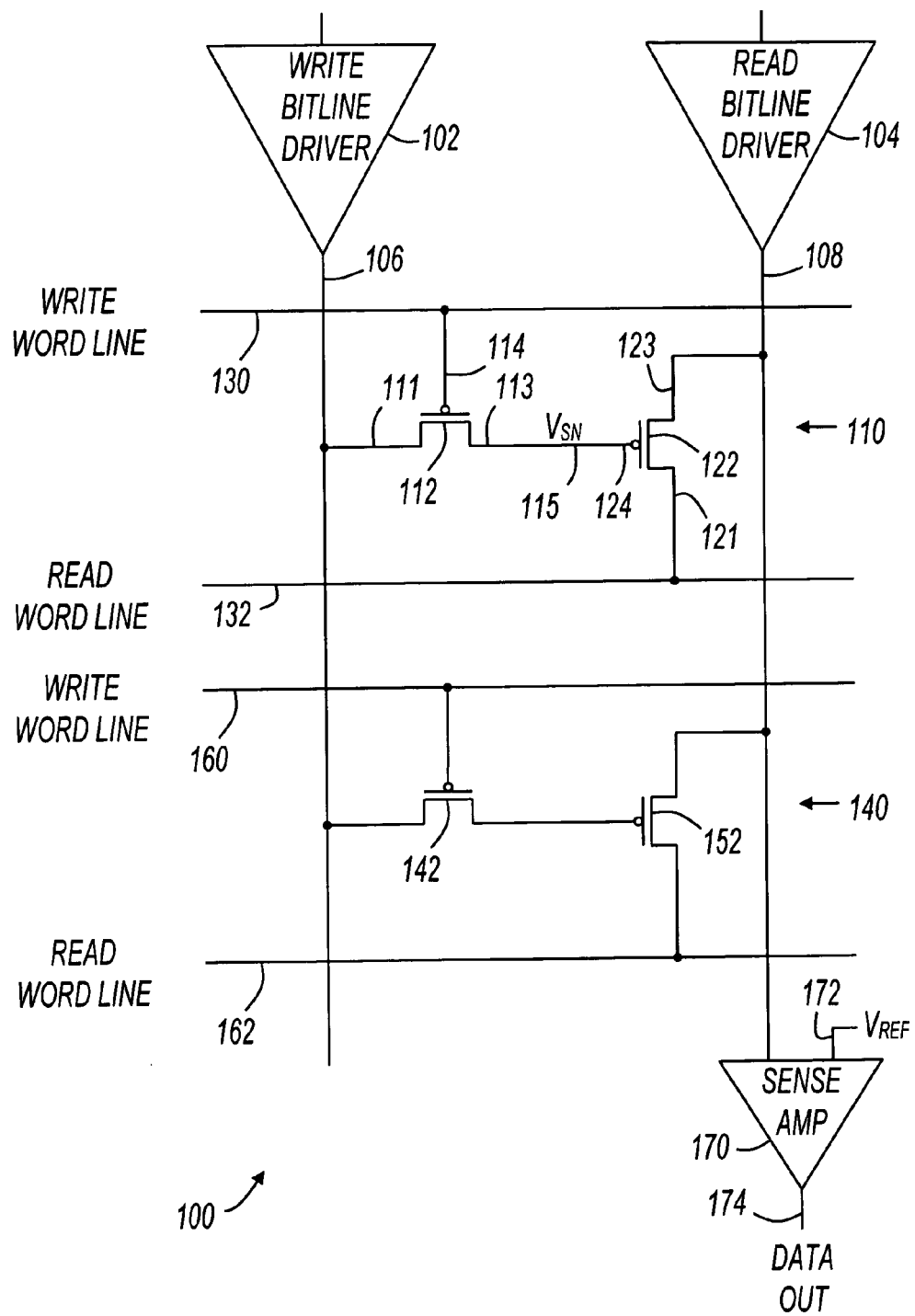
FIG. 1 shows a diagram of a portion of a memory device.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

FIG. 1 shows a diagram of a portion of a memory device. Memory device 100 includes write bit line driver 102, read bit line driver 104, sense amplifier 170, and two two-transistor gain cells arranged in a column. Two transistor gain cell 110 includes write transistor 112 and read transistor 122, and two transistor gain cell 140 includes write transistor 142 and read transistor 152. Two transistor gain cell 110 is coupled to write word line 130, read word line 132, write bit line 106, and read bit line 108. Two transistor gain cell 140 is coupled to write word line 160, read word line 162, write bit line 106, and read bit line 108.

The transistors in FIG. 1 are shown as isolated gate transistors. More specifically, transistors 112, 122, 142, and 152 are shown as P-type metal oxide semiconductor field effect transistors (PMOSFETs). The types of transistors, and their method of fabrication, are not limitations of the various embodiments of the present invention. For example, although the transistors shown in FIG. 1 are depicted as PMOSFETs, other types of transistors, including transistors without isolated gates, may be utilized in various embodiments of the present invention. Further, in some embodiments, the transistors shown in FIG. 1 are implemented using silicon-on-insulator (SOI) technology, and in other embodiments, they are implemented using bulk silicon technology.

FIG. 1 shows two gain cells arranged in a column and sharing a write bit line and a read bit line. In some embodiments, more than two gain cells are arranged in a column sharing a write bit line and a read bit line. Further, in some embodiments, multiple columns exist, such that rows of two transistor gain cells share write word lines and read word lines. Any number of rows and any number of columns may exist without departing from the scope of the present invention.

Write transistor 112 includes source/drain node 111 coupled to write bit line 106, gate node 114 coupled to write word line 130, and source/drain node 113 coupled to storage node 115. Read transistor 122 includes gate node 124 coupled to storage node 115, source/drain node 123 coupled to read bit line 108, and source/drain node 121 coupled to read word line 132.

In operation, when cell 110 is not selected to read or write, it is considered to be in hold state, in which write word line 130 is high, read word line 132 and read bit line 108 are low, and write bit line 106 can be either low or high. Both write and read devices are turned off, and the stored voltage is preserved. Storage node 115 holds a voltage $V_{SN}$ that determines whether gain cell 110 holds a "1" or a "0." Data is written to gain cell 110 when write transistor 112 is turned on, and $V_{SN}$ is influenced by the voltage present on write bit line 106. Data is read from gain cell 110 when read transistor 122 is turned on, and a voltage on read bit line 108 changes based in part on $V_{SN}$. Sense amplifier 170 compares the voltage on read bit line 108 with a reference voltage $V_{REF}$ on node 172, and data is output on node 174. As used herein, $V_{SN0}$ is used to represent $V_{SN}$ when the gain cell holds a "0," and $V_{SN1}$ is used to represent $V_{SN}$ when the gain cell holds a "1."

When writing data to gain cell 110, write word line 130 is driven with a voltage sufficient to cause write transistor 112 to turn on, and write bit line driver 102 drives a voltage on write bit line 106 to store a voltage corresponding to either a "1" or "0" on storage node 115. When referring to FIG. 1, a "1" is considered to be held in gain cell 110 when a higher potential is stored on node 1115, and a "0" is considered to be held in gain cell 110 when a lower potential is stored on node 115, but the various embodiments of the present invention are not so limited. For example, in some embodiments, a "0" is represented by a higher potential than the potential representing a "1" on node 115.

In some embodiments, a "0" is written to gain cell 110 when write bit line driver 102 drives write bit line 106 with a low voltage, commonly referred to as "$V_{SS}$" or "ground." In these embodiments, $V_{SN0}$ will be substantially equal to the threshold voltage ($V_T$) of write transistor 112 because write transistor 112 will experience a voltage drop of substantially $V_T$. In other embodiments, write bit line driver 102 drives a voltage higher than ground onto write bit line 106 when writing a "0" so that a "0" is represented by a $V_{SN0}$ higher than $V_T$. These and other embodiments are described in more detail with reference to the following figures.

In some embodiments, a "1" is written to gain cell 110 when write bit line driver 102 drives write bit line 106 with a high voltage, commonly referred to as "$V_{CC}$." In these embodiments, $V_{SN1}$ will be substantially equal to $V_{CC}$. In other embodiments, a voltage other than $V_{CC}$ may be driven on write bit line 106 when writing a "1."

When reading data from gain cell 110, read word line 132 is driven with a voltage large enough to begin to turn on read transistor 122 when storage node 115 holds $V_{SN0}$. For example, in embodiments in which $V_{SN0}$ substantially equals $V_T$, read word line 132 is driven to a voltage near or above $2V_T$ to create a source to gate voltage ($V_{SG}$) of $V_T$ or above. In general, read word line 132 may be driven with a voltage at, near, or above $V_{SN0}+V_T$ to begin to turn on read transistor 122. In some embodiments, read word line 132 may be driven with a high voltage such as $V_{CC}$.

When read transistor 122 is turned on during a read of gain cell 110, current flows from read word line 132 to read bit line 108. Different amounts of current flow depending on whether storage node 115 has a stored voltage of $V_{SN0}$ or $V_{SN1}$. The voltage on read bit line 108 increases due to current flowing through read transistor 122, and at some point in time, sense amplifier 170 compares the voltage on read bit line 108 with $V_{REF}$ to sense the data. The voltage developed on read bit line 108 varies depending in part on whether storage node 115 has a stored voltage of $V_{SN0}$ or $V_{SN1}$. As used herein, $V_{RBL0}$ is used to represent the read bit line voltage that develops when the storage node stores $V_{SN0}$, and $V_{RBL1}$ is used to represent the read bit line voltage that develops when the storage node stores $V_{SN1}$.

In some embodiments, the read cycle (the period for which a raised voltage appears on read word line 132) lasts long enough to develop a sufficient voltage on read bit line 108, but not so long that a large enough voltage develops to corrupt data stored in other gain cells of the same column. For example, if gain cell 110 is being read and gain cell 140 has a stored $V_{SN0}$ of $V_T$, then the read cycle of gain cell 110 may last long enough to develop a voltage to be sensed on read bit line 108, but the read cycle is ended before read bit line 108 develops a voltage approaching $2V_T$ which would turn on read transistor 152 and corrupt data stored in gain cell 140. In general, the read cycle is stopped before the voltage on read bit line 108 approaches $V_{SN0}+V_T$. In embodiments where $V_{SN1}<V_{SN0}$, the read cycle is stopped before the voltage on read bit line 108 approaches $V_{SN1}+V_T$.

Various embodiments of the present invention provide mechanisms to extend the read cycle to allow the difference between $V_{RBL0}$ and $V_{RBL1}$ to be large without allowing either $V_{RBL0}$ or $V_{RBL1}$ to become large enough to corrupt data stored in other gain cells. In some embodiments, the voltage stored for $V_{SN0}$ may be set to a voltage larger than $V_T$. In these embodiments, $V_{RBL0}$ may become larger without corrupting data in other cells of the same column, so the read cycle may be extended to allow a larger differential to develop between $V_{RBL0}$ and $V_{RBL1}$. Also in some embodiments, read bit line driver 104 may include circuitry to precharge read bit line 108 to a voltage that allows the read cycle to be extended. For example, read bit line driver 104 may include circuitry to precharge read bit line 108 to increase the voltage differential between storage node 115 and read bit line 108. In embodiments where $V_{SN0}$ is substantially equal to $V_T$, read bit line driver 104 may precharge read bit line 108 to a negative voltage. In still further embodiments, $V_{SN0}$ may be set to a voltage larger than $V_T$ and read bit line driver 104 may precharge read bit line 108. These and other embodiments are further described below with reference to the remaining figures.

Figure 2:
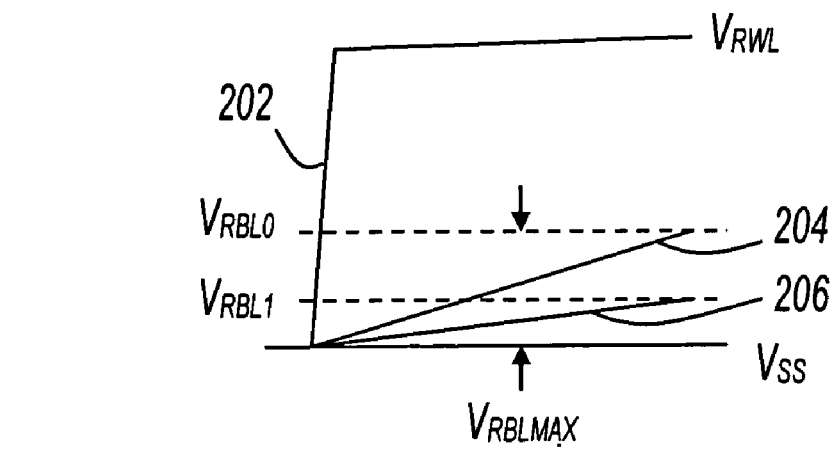
FIGS. 2 and 3 show read cycle waveforms in accordance with various embodiments of the present invention.

FIG. 2 shows waveforms depicting a read cycle in accordance with various embodiments of the present invention. Waveforms 200 include waveforms 202, 204, and 206. Waveform 202 shows $V_{RWL}$, which is the read word line voltage when reading a two transistor gain cell. For example, $V_{RWL}$ may be the voltage on read word line 132 (FIG. 1) when performing a read of two transistor gain cell 110. Waveform 204 shows a read bit line voltage that develops on a read bit line when a two transistor gain cell has a voltage of $V_{SN0}$ stored on a storage node, and waveform 206 shows a read bit line voltage that develops on a read bit line when a two transistor gain cell has a voltage of $V_{SN1}$ stored on a storage node. In practice, waveforms 204 and 206 do not exist simultaneously; rather, waveform 204 will appear when reading a gain cell having a storage node at $V_{SN0}$, and waveform 206 will appear when reading a gain cell having a storage node at $V_{SN1}$.

Waveforms 204 and 206 are shown superimposed in FIG. 2 to demonstrate the difference between $V_{RBL0}$ and $V_{RBL1}$. $V_{RBL0}$ is the voltage to which the read bit line will develop during the read cycle when reading a "0," and $V_{RBL1}$ is the voltage to which the read bit line will develop during the read cycle when reading a "1." As described above with reference to FIG. 1, as the read cycle progresses, the difference between $V_{RBL0}$ and $V_{RBL1}$ increases. $V_{REF}$ may be set to a value between $V_{RBL0}$ and $V_{RBL1}$, and when the difference between $V_{RBL0}$ and $V_{RBL1}$ is large, fewer read errors may occur.

Also shown in FIG. 2 is $V_{RBLMAX}$, which is the maximum voltage that a read bit line may reach without causing corruption to other two transistor gain cells. In some embodiments, $V_{RBLMAX}$ is equal to $V_{SN0}+V_T$. In some embodiments of the present invention, $V_{SN0}$ is set to a value above $V_T$ to increase $V_{RBLMAX}$, which in turn allows the read cycle to last longer and a larger difference to be developed between $V_{RBL0}$ and $V_{RBL1}$.

Figure 3:
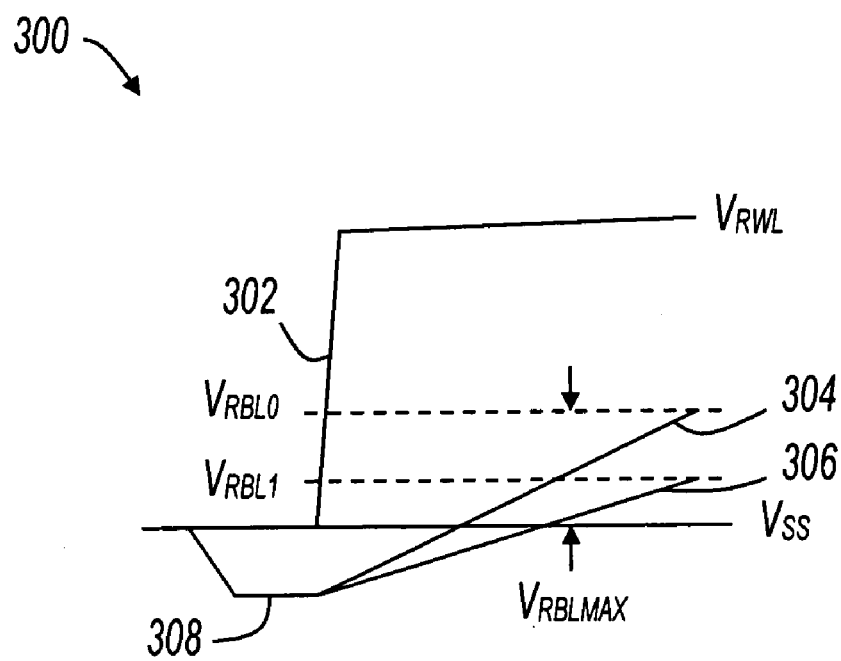

FIG. 3 shows waveforms depicting a read cycle in accordance with various embodiments of the present invention. Waveforms 300 include waveforms 302, 304, 306, and 308. Waveform 302 shows $V_{RWL}$, which is the read word line voltage when reading a two transistor gain cell. For example, $V_{RWL}$ may be the voltage on read word line 132 (FIG. 1) when performing a read of two transistor gain cell 110. Waveform 308 shows a precharged read bit line. For example, waveform 308 may represent the voltage on read bit line 108 (FIG. 1) when precharged by read bit line driver 104. Waveform 304 shows a read bit line voltage that develops on a read bit line when a two transistor gain cell has a voltage of $V_{SN0}$ stored on a storage node, and waveform 306 shows a read bit line voltage that develops on a read bit line when a two transistor gain cell has a voltage of $V_{SN1}$ stored on a storage node. In practice, waveforms 304 and 306 do not exist simultaneously; rather, waveform 304 will appear on a precharged read bit line when reading a gain cell having a storage node at $V_{SN0}$, and waveform 306 will appear on a precharged read bit line when reading a gain cell having a storage node at $V_{SN1}$.

Waveforms 304 and 306 are shown superimposed in FIG. 3 to demonstrate the difference between $V_{RBL0}$ and $V_{RBL1}$. $V_{RBL0}$ is the voltage to which the precharged read bit line will develop during the read cycle when reading a "0," and $V_{RBL1}$ is the voltage to which the precharged read bit line will develop during the read cycle when reading a "1." As described above with reference to FIG. 1, as the read cycle progresses, the difference between $V_{RBL0}$ and $V_{RBL1}$ increases. By precharging the read bit line, the read cycle may be extended to increase the difference between $V_{RBL0}$ and $V_{RBL1}$ without corrupting other two transistor gain cells. $V_{REF}$ may be set to a value between $V_{RBL0}$ and $V_{RBL1}$, and when the difference between $V_{RBL0}$ and $V_{RBL1}$ is large, fewer read errors may occur.

Also shown in FIG. 3 is $V_{RBLMAX}$, which is the maximum voltage that a read bit line may reach without causing corruption to other two transistor gain cells. In some embodiments, $V_{RBLMAX}$ is equal to $V_{SN0}+V_T$. In some embodiments of the present invention, in addition to utilizing a precharged read bit line, $V_{SN0}$ is set to a value above $V_T$ to increase $V_{RBLMAX}$, which in turn allows the read cycle to last longer and a larger difference to be developed between $V_{RBL0}$ and $V_{RBL1}$.

Figure 4:
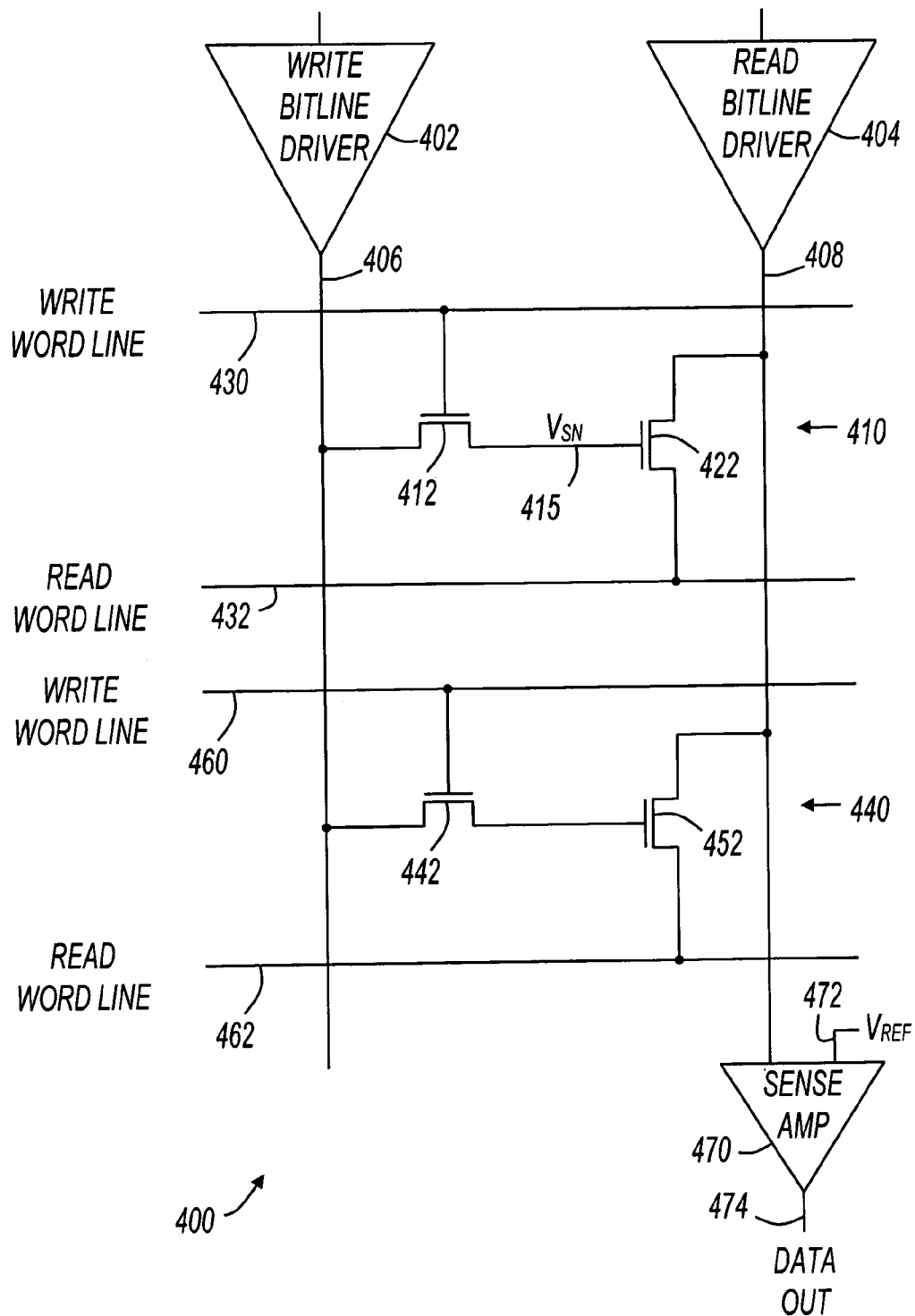
FIG. 4 shows a diagram of a portion of a memory device.

FIG. 4 shows a diagram of a portion of a memory device. Memory device 400 includes write bit line driver 402, read bit line driver 404, sense amplifier 470, and two two-transistor gain cells arranged in a column. Two transistor gain cell 410 includes write transistor 412 and read transistor 422, and two transistor gain cell 440 includes write transistor 442 and read transistor 452. Two transistor gain cell 410 is coupled to write word line 430, read word line 432, write bit line 406, and read bit line 408. Two transistor gain cell 440 is coupled to write word line 460, read word line 462, write bit line 406, and read bit line 408.

The transistors in FIG. 4 are shown as isolated gate transistors. More specifically, transistors 412, 422, 442, and 452 are shown as N-type metal oxide semiconductor field effect transistors (NMOSFETs). The types of transistors, and their method of fabrication, are not limitations of the various embodiments of the present invention. For example, although the transistors shown in FIG. 4 are depicted as NMOSFETs, other types of transistors, including transistors without isolated gates, may be utilized in various embodiments of the present invention. Further, in some embodiments, the transistors shown in FIG. 4 are implemented using silicon-on-insulator (SOI) technology, and in other embodiments, they are implemented using bulk silicon technology.

Memory device 400 is similar to memory device 100 (FIG. 1) except that the transistors are N-type rather than P-type. Data is written to gain cell 410 when write transistor 412 is turned on, and $V_{SN}$ is influenced by the voltage present on write bit line 406. Data is read from gain cell 410 when read transistor 422 is turned on, and a voltage on read bit line 408 changes based in part on $V_{SN}$. Sense amplifier 470 compares the voltage on read bit line 408 with a reference voltage $V_{REF}$ on node 472, and data is output on node 474.

When writing data to gain cell 410, write word line 430 is driven with a voltage sufficient to cause write transistor 412 to turn on, and write bit line driver 402 drives a voltage on write bit line 406 to store a voltage corresponding to either a "1" or "0" on storage node 415. When referring to FIG. 4, a "0" is considered to be held in gain cell 410 when a higher potential is stored on node 415, and a "1" is considered to be held in gain cell 410 when a lower potential is stored on node 415, but the various embodiments of the present invention are not so limited. For example, in some embodiments, a "1" is represented by a higher potential than the potential representing a "0" on node 415.

In some embodiments, a "0" is written to gain cell 410 when write bit line driver 402 drives write bit line 406 with a high voltage, commonly referred to as "$V_{CC}$." In these embodiments, $V_{SN0}$ will be substantially equal to $V_{CC}$ minus the threshold voltage ($V_T$) of write transistor 412 because write transistor 412 will experience a voltage drop of substantially $V_T$. In other embodiments, write bit line driver 402 drives a voltage lower than $V_{CC}$ onto write bit line 406 when writing a "0" so that a "0" is represented by a $V_{SN0}$ lower than $V_{CC}-V_T$. These and other embodiments are described in more detail with reference to the following figures.

In some embodiments, a "1" is written to gain cell 410 when write bit line driver 402 drives write bit line 406 with a low voltage, commonly referred to as "$V_{SS}$" or "ground." In these embodiments, $V_{SN1}$ will be substantially equal to ground. In other embodiments, a voltage other than ground may be driven on write bit line 406 when writing a "1."

When reading data from gain cell 410, read word line 432 is driven with a voltage low enough to begin to turn on read transistor 422 when storage node 415 holds $V_{SN0}$. For example, in embodiments in which $V_{SN0}$ substantially equals $V_{CC}-V_T$, read word line 432 is driven to a voltage near or below $V_{CC}-2V_T$ to create a gate to source voltage ($V_{GS}$) of $V_T$ or above. In general, read word line 432 may be driven with a voltage at, near, or below $V_{SN0}-V_T$ to begin to turn on read transistor 422. In some embodiments, read word line 432 may be driven with a low voltage such as $V_{SS}$.

When read transistor 422 is turned on during a read of gain cell 410, current flows from read bit line 408 to read word line 432. Different amounts of current flow depending on whether storage node 415 has a stored voltage of $V_{SN0}$ or $V_{SN1}$. The voltage on read bit line 408 decreases due to current flowing through read transistor 422, and at some point in time, sense amplifier 470 compares the voltage on read bit line 408 with $V_{REF}$ to sense the data. The voltage developed on read bit line 408 varies depending in part on whether storage node 415 has a stored voltage of $V_{SN0}$ or $V_{SN1}$. As described above, $V_{RBL0}$ represents the read bit line voltage that develops when the storage node stores $V_{SN0}$, and $V_{RBL1}$ represents the read bit line voltage that develops when the storage node stores $V_{SN1}$.

In some embodiments, the read cycle (the period for which a lowered voltage appears on read word line 432) lasts long enough to develop a sufficient voltage on read bit line 408, but not so long that a large enough voltage develops to corrupt data stored in other gain cells of the same column. For example, if gain cell 410 is being read and gain cell 440 has a stored $V_{SN0}$ of $V_{CC}-V_T$, then the read cycle of gain cell 410 may last long enough to develop a voltage to be sensed on read bit line 408, but the read cycle is ended before read bit line 408 develops a voltage approaching $V_{CC}-2V_T$ which would turn on read transistor 452 and corrupt data stored in gain cell 440. In general, the read cycle may be stopped before the voltage on read bit line 408 approaches $V_{SN0}-V_T$. In embodiments where $V_{SN1}>V_{SN0}$, the read cycle may be stopped before the voltage on read bit line 408 approaches $V_{SN1}-V_T$.

Various embodiments of the present invention provide mechanisms to extend the read cycle to allow the difference between $V_{RBL0}$ and $V_{RBL1}$ to be large without allowing either $V_{RBL0}$ or $V_{RBL1}$ to become low enough to corrupt data stored in other gain cells. In some embodiments, the voltage stored for $V_{SN0}$ may be set to a voltage less than $V_{CC}-V_T$. In these embodiments, $V_{RBL0}$ may become smaller without corrupting data in other cells of the same column, so the read cycle may be extended to allow a larger differential to develop between $V_{RBL0}$ and $V_{RBL1}$. Also in some embodiments, read bit line driver 404 may include circuitry to precharge read bit line 408 to a voltage that allows the read cycle to be extended. For example, read bit line driver 404 may include circuitry to precharge read bit line 408 to increase the voltage differential between storage node 415 and read bit line 408. In embodiments where $V_{SN0}$ is substantially equal to $V_{CC}-V_T$, read bit line driver 404 may precharge read bit line 408 to a voltage greater than $V_{CC}$. In still further embodiments, $V_{SN0}$ may be set to a voltage less than $V_{CC}-V_T$ and read bit line driver 404 may precharge read bit line 408. These and other embodiments are further described below with reference to the remaining figures.

Figure 5:
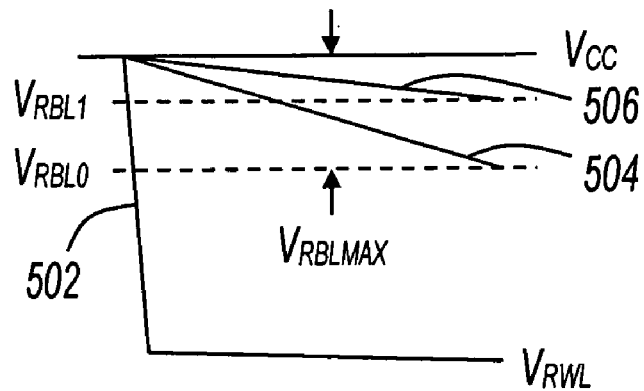
FIGS. 5 and 6 show read cycle waveforms in accordance with various embodiments of the present invention.

FIG. 5 shows waveforms depicting a read cycle in accordance with various embodiments of the present invention. Waveforms 500 include waveforms 502, 504, and 506. Waveform 502 shows $V_{RWL}$, which is the read word line voltage when reading a two transistor gain cell. For example, $V_{RWL}$ may be the voltage on read word line 432 (FIG. 4) when performing a read of two transistor gain cell 410. Waveform 504 shows a read bit line voltage that develops on a read bit line when a two transistor gain cell has a voltage of $V_{SN0}$ stored on a storage node, and waveform 506 shows a read bit line voltage that develops on a read bit line when a two transistor gain cell has a voltage of $V_{SN1}$ stored on a storage node. In practice, waveforms 504 and 506 do not exist simultaneously; rather, waveform 504 will appear when reading a gain cell having a storage node at $V_{SN0}$, and waveform 506 will appear when reading a gain cell having a storage node at $V_{SN1}$.

Waveforms 504 and 506 are shown superimposed in FIG. 5 to demonstrate the difference between $V_{RBL0}$ and $V_{RBL1}$. $V_{RBL0}$ is the voltage to which the read bit line will develop during the read cycle when reading a "0," and $V_{RBL1}$ is the voltage to which the read bit line will develop during the read cycle when reading a "1." As described above with reference to FIGS. 1 and 4, as the read cycle progresses, the difference between $V_{RBL0}$ and $V_{RBL1}$ increases. $V_{REF}$ may be set to a value between $V_{RBL0}$ and $V_{RBL1}$, and when the difference between $V_{RBL0}$ and $V_{RBL1}$ is large, fewer read errors may occur.

Also shown in FIG. 5 is $V_{RBLMAX}$, which is the maximum voltage that a read bit line may drop from $V_{CC}$ without causing corruption to other two transistor gain cells. In some embodiments, $V_{RBLMAX}$ is equal to $V_{CC}-(V_{SN0}-V_T)$. In some embodiments of the present invention, $V_{SN0}$ is set to a value below $V_{CC}-V_T$ to increase $V_{RBLMAX}$, which in turn allows the read cycle to last longer and a larger difference to be developed between $V_{RBL0}$ and $V_{RBL1}$.

Figure 6:
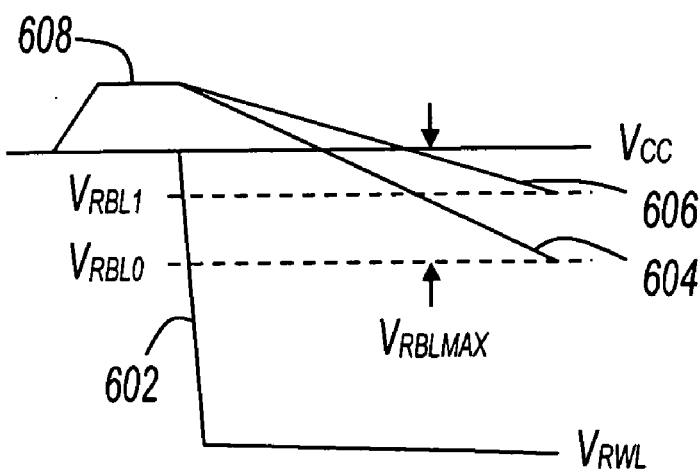

FIG. 6 shows waveforms depicting a read cycle in accordance with various embodiments of the present invention. Waveforms 600 include waveforms 602, 604, 606, and 608. Waveform 602 shows $V_{RWL}$, which is the read word line voltage when reading a two transistor gain cell. For example, $V_{RWL}$ may be the voltage on read word line 432 (FIG. 4) when performing a read of two transistor gain cell 410. Waveform 608 shows a precharged read bit line. For example, waveform 608 may represent the voltage on read bit line 408 (FIG. 4) when precharged by read bit line driver 404. Waveform 604 shows a read bit line voltage that develops on a read bit line when a two transistor gain cell has a voltage of $V_{SN0}$ stored on a storage node, and waveform 606 shows a read bit line voltage that develops on a read bit line when a two transistor gain cell has a voltage of $V_{SN1}$ stored on a storage node. In practice, waveforms 604 and 606 do not exist simultaneously; rather, waveform 604 will appear on a precharged read bit line when reading a gain cell having a storage node at $V_{SN0}$, and waveform 606 will appear on a precharged read bit line when reading a gain cell having a storage node at $V_{SN1}$.

Waveforms 604 and 606 are shown superimposed in FIG. 6 to demonstrate the difference between $V_{RBL0}$ and $V_{RBL1}$. $V_{RBL0}$ is the voltage to which the precharged read bit line will develop during the read cycle when reading a "0," and $V_{RBL1}$ is the voltage to which the precharged read bit line will develop during the read cycle when reading a "1." As described above with reference to FIGS. 1 and 4, as the read cycle progresses, the difference between $V_{RBL0}$ and $V_{RBL1}$ increases. By precharging the read bit line, the read cycle may be extended to increase the difference between $V_{RBL0}$ and $V_{RBL1}$ without corrupting other two transistor gain cells. $V_{REF}$ may be set to a value between $V_{RBL0}$ and $V_{RBL1}$, and when the difference between $V_{RBL0}$ and $V_{RBL1}$ is large, fewer read errors may occur.

Also shown in FIG. 6 is $V_{RBLMAX}$, which is the maximum voltage that a read bit line may reach without causing corruption to other two transistor gain cells. In some embodiments, $V_{RBLMAX}$ is equal to $V_{CC}-(V_{SN0}-V_T)$. In some embodiments of the present invention, in addition to utilizing a precharged read bit line, $V_{SN0}$ is set to a value lower than $V_{CC}-V_T$ to increase $V_{RBLMAX}$, which in turn allows the read cycle to last longer and a larger difference to be developed between $V_{RBL0}$ and $V_{RBL1}$.

Figure 7:
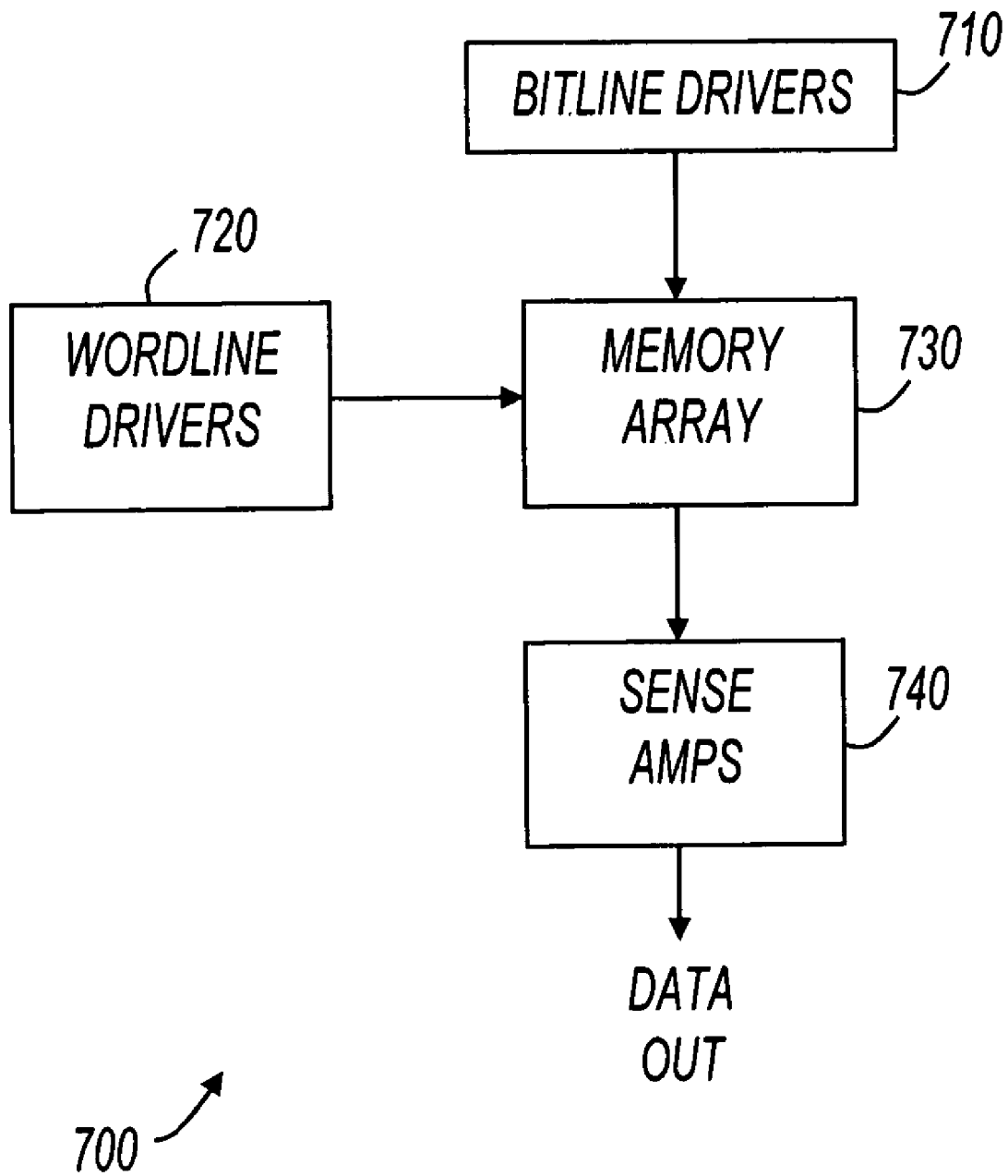
FIG. 7 shows a memory device in accordance with various embodiments of the present invention.

FIG. 7 shows a memory device in accordance with various embodiments of the present invention. Memory device 700 includes bit line drivers 710, word line drivers 720, memory array 730, and sense amps 740. In some embodiments, memory array 730 includes a column of two transistor gain cells such as those shown in FIGS. 1 and 4. Also in some embodiments, memory array 730 may include multiple columns of two transistor gain cells. In these embodiments, each column of gain cells may share a write bit line and a read bit line, and each row of gain cells may share a write word line and a read word line.

Bit line drivers 710 may include write bit line drivers and read bit line drivers that operate in accordance with the previous descriptions of line drivers. For example, bit line drivers 710 may include one or more write bit line drivers that include circuitry to charge a storage node to multiple different voltages, where one voltage is substantially equal to the $V_T$ of the transistors in the gain cells. Also for example, bit line drivers 710 may include one or more write bit line drivers that include circuitry to charge a storage node to multiple different voltages, where each of the multiple voltages are above the $V_T$ of the transistors in the gain cells. Further, bit line drivers 710 may include one or more read bit line drivers that include circuitry to precharge a read bit line to increase a voltage differential between a storage node and the read bit line when performing a read cycle.

Sense amplifiers 740 may include any number of sense amplifiers. For example, sense amplifiers 740 may include one sense amplifier for each column as shown in FIGS. 1 and 4, or sense amplifiers 740 may include fewer sense amplifiers that are shared among various columns in memory array 730. The number of arrangement of sense amplifiers in sense amplifiers 740 is not a limitation of the present invention.

In some embodiments, memory device 700 is part of an integrated circuit. For example, memory device 700 may be a packaged integrated circuit that includes an interface to allow memory device 700 be used as part of an electronic system. Also for example, memory device 700 may be included in a packaged integrated circuit that also includes other components, functional blocks, or subsystems. Further, in some embodiments, memory device 700 may be part of an unpackaged integrated circuit die that is sold as an unpackaged device.

Figure 8:
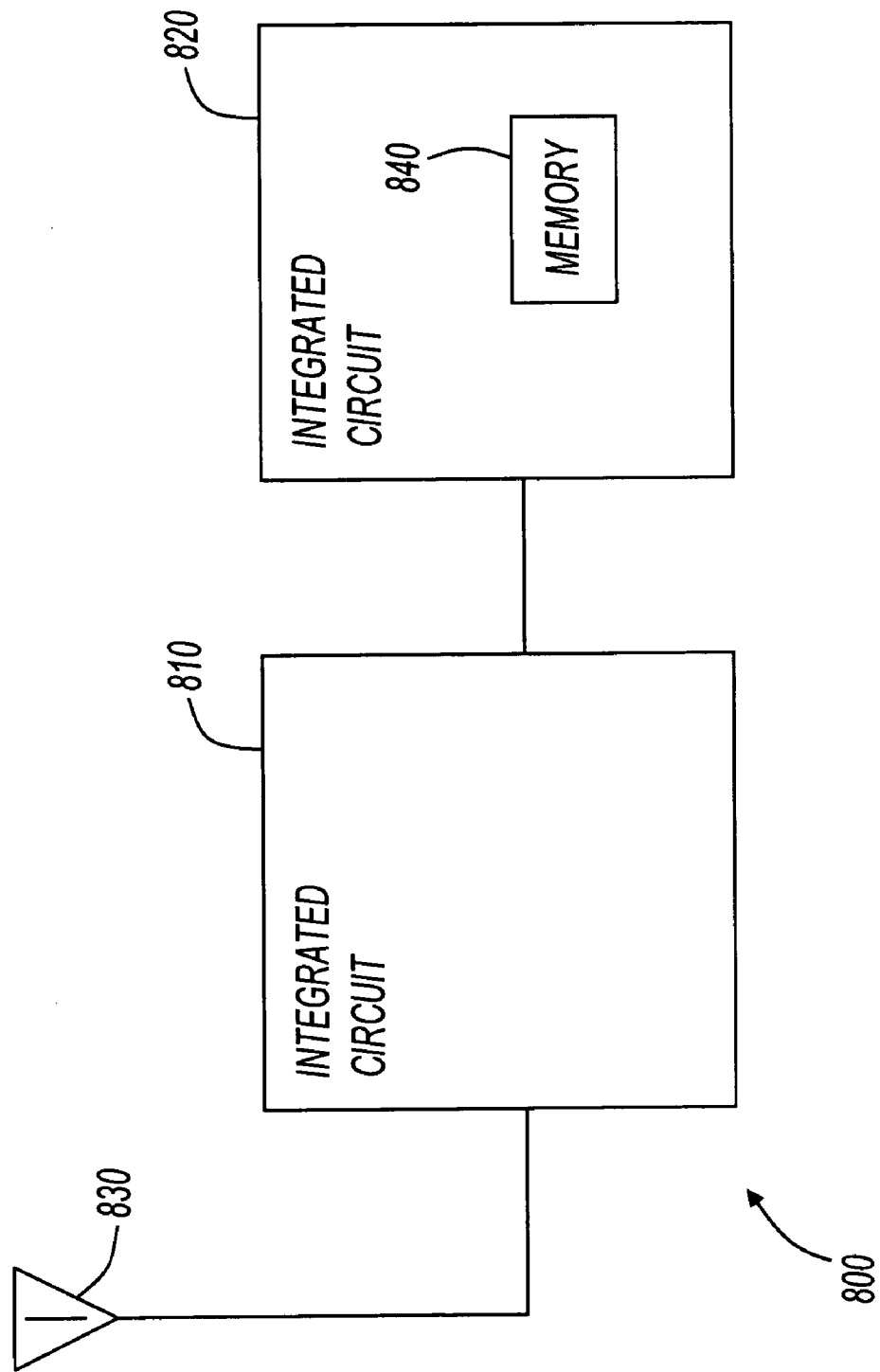
FIG. 8 shows a system diagram in accordance with various embodiments of the present invention.

FIG. 8 shows a system diagram in accordance with various embodiments of the present invention. FIG. 8 shows system 800 including integrated circuits 810 and 820, and antenna 830. In operation, system 800 receives a signal using antenna 830, and the signal is processed by the various elements shown in FIG. 8. Antenna 830 may be a directional antenna or an omni-directional antenna. As used herein, the term omni-directional antenna refers to any antenna having a substantially uniform pattern in at least one plane. For example, in some embodiments, antenna 830 may be an omni-directional antenna such as a dipole antenna, or a quarter wave antenna. Also for example, in some embodiments, antenna 830 may be a directional antenna such as a parabolic dish antenna or a Yagi antenna. In some embodiments, antenna 830 may include multiple physical antennas.

Integrated circuit 810 may include a radio frequency (RF) receiver, transmitter, or transceiver coupled to antenna 830. For example, in some embodiments, an RF receiver receives a signal from antenna 830 and performs "front end" processing such as low noise amplification (LNA), filtering, frequency conversion or the like.

Integrated circuit 820 includes memory 840. In some embodiments, memory 840 may include two transistor gain cells. For example, memory 840 may utilize two transistor gain cells with write bit line drivers and read bit line drivers such as those shown in, and described with reference to, FIGS. 1–7. Also for example, memory 840 may include various embodiments of the present invention to extend a read cycle or to increase a voltage differential on a read bit line as described with reference to the previous figures.

In some embodiments, integrated circuit 820 may be a processor such as a microprocessor, a digital signal processor, a microcontroller, or the like. In some of these embodiments, memory 840 may be a cache memory on the same integrated circuit die. In other embodiments, memory 840 may be a cache memory co-located with a processor such as in a large package or multi-chip module. Memory 840 is shown used with an antenna in system 800. Many other uses for memory 840 exist. For example, memory 840 may be used in systems without an antenna.

Either integrated circuit 810 or 820 may be a processor or an integrated circuit other than a processor such as a radio frequency (RF) receiver, transmitter, or transceiver, an application-specific integrated circuit (ASIC), a communications device, a memory controller, or a memory such as a dynamic random access memory (DRAM). For ease of illustration, portions of integrated circuits 810 and 820 are not shown. The integrated circuits may include much more circuitry than illustrated in FIG. 8 without departing from the scope of the present invention.

Systems represented by the various foregoing figures can be of any type. Examples of represented systems include computers (e.g., desktops, laptops, handhelds, servers, tablets, web appliances, routers, etc.), wireless communications devices (e.g., cellular phones, cordless phones, pagers, personal digital assistants, wireless network interfaces, etc.), computer-related peripherals (e.g., printers, scanners, monitors, etc.), entertainment devices (e.g., televisions, radios, stereos, tape and compact disc players, video cassette recorders, camcorders, digital cameras, MP3 (Motion Picture Experts Group, Audio Layer 3) players, video games, watches, etc.), and the like.

Two transistor gain cells, word line drivers, bit line drivers, memory arrays, and other embodiments of the present invention can be implemented in many ways. In some embodiments, they are implemented in integrated circuits as part of memory devices. In some embodiments, design descriptions of the various embodiments of the present invention are included in libraries that enable designers to include them in custom or semi-custom designs. For example, any of the disclosed embodiments can be implemented in a synthesizable hardware design language, such as VHDL or Verilog, and distributed to designers for inclusion in standard cell designs, gate arrays, or the like. Likewise, any embodiment of the present invention can also be represented as a hard macro targeted to a specific manufacturing process.

Figure 9:
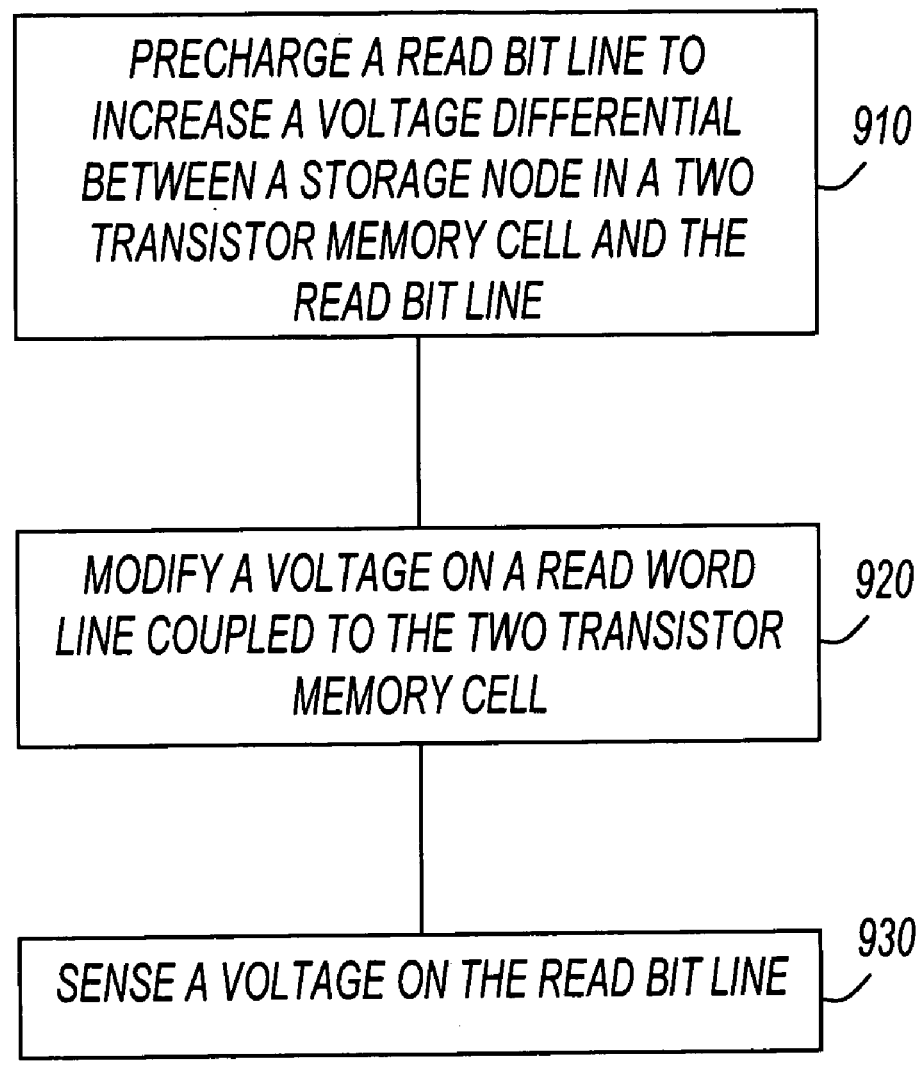
FIG. 9 shows a flowchart in accordance with various embodiments of the present invention.

FIG. 9 shows a flowchart in accordance with various embodiments of the present invention. In some embodiments, method 900 may be used to read one or more two transistor gain cells. In some embodiments, method 900, or portions thereof, is performed by a memory device, embodiments of which are shown in the various figures. In other embodiments, method 900 is performed by a control circuit within a memory device. Method 900 is not limited by the particular type of apparatus or software element performing the method. The various actions in method 900 may be performed in the order presented, or may be performed in a different order. Further, in some embodiments, some actions listed in FIG. 9 are omitted from method 900.

Method 900 is shown beginning at block 910 in which a read bit line is precharged to increase a voltage differential between a storage node in a two transistor memory cell and the read bit line. In some embodiments, the acts of 910 correspond to a read bit line driver such as read bit line driver 104 (FIG. 1) or read bit line driver 404 (FIG. 4) precharging a bit line as part of a read cycle or just prior to a read cycle. Further the acts of 910 may be represented by waveform 308 in FIG. 3 or by waveform 608 in FIG. 6.

At 920, a voltage on a read word line is modified. This may correspond to modifying a read word line voltage to turn on a read transistor such as read transistor 122 (FIG. 1) or read transistor 422 (FIG. 4). The read word line voltage may be modified in such a manner that the read transistor turns on regardless of the stored voltage that appears on the control node of the read transistor, or the read word line voltage may be modified in a such a manner that the read transistor turns on strongly for one stored voltage value and turns on weakly or not at all for another stored voltage value.

When the read word line voltage is modified at 920, the read bit line voltage on the precharged bit line begins to change. At 930, the read bit line voltage is sensed. The read bit line may be sensed after the read bit line voltage has been sufficiently developed, but before the read bit line voltage has changed enough to corrupt data held in other two transistor memory cells.

Although the present invention has been described in conjunction with certain embodiments, it is to be understood that modifications and variations may be resorted to without departing from the spirit and scope of the invention as those skilled in the art readily understand. Such modifications and variations are considered to be within the scope of the invention and the appended claims.

What is claimed is:

1. A method of reading a two transistor memory cell comprising:
   precharging a read bit line to increase a voltage differential between a storage node in the two transistor memory cell and the read bit line;

modifying a voltage on a read word line coupled to the two transistor memory cell; and sensing a voltage on the read bit line;

wherein precharging comprises reducing a read bit line voltage coupled to a source/drain node of a P-type isolated gate transistor within the two transistor memory cell, and wherein the storage node corresponds to a gate node of the P-type isolated gate transistor.

2. The method of claim 1 wherein modifying a voltage on a read word line comprises increasing a voltage of a second source/drain node of the P-type isolated gate transistor.

3. A method of reading a two transistor memory cell comprising:

precharging a read bit line to increase a voltage differential between a storage node in the two transistor memory cell and the read bit line;

modifying a voltage on a read word line coupled to the two transistor memory cell; and sensing a voltage on the read bit line;

wherein precharging comprises increasing a read bit line voltage coupled to a source/drain node of an N-type isolated gate transistor within the two transistor memory cell, and wherein the storage node corresponds to a gate node of the N-type isolated gate transistor.

4. The method of claim 3 wherein modifying a voltage on a read word line comprises decreasing a voltage of a second source/drain node of the N-type isolated gate transistor.

5. A memory device comprising:

a plurality of two transistor gain cells arranged in a column;

a write bit line and a read bit line coupled to the plurality of two transistor gain cells; and a driver circuit coupled to precharge the read bit line when performing a read, wherein the driver circuit includes circuitry to reduce a voltage on the read bit line.

6. The memory device of claim 5 wherein each of the plurality of two transistor gain cells comprises isolated gate transistors.

7. The memory device of claim 5 wherein each of the plurality of two transistor gain cells comprises:

a write transistor having a first source/drain node coupled to the write bit line and a second source/drain node coupled to a storage node; and a read transistor having a control node coupled to the storage node, a first source/drain node coupled to the read bit line, and a second source/drain node coupled to a read word line.

8. The memory device of claim 7 wherein the write transistor and the read transistor comprise P-type isolated gate transistors.

9. The memory device of claim 7 wherein the write transistor and the read transistor comprise N-type isolated gate transistors.

10. A memory device comprising:

a plurality of two transistor gain cells arranged in a colunm;

a write bit line and a read bit line coupled to the plurality of two transistor gain cells; and a driver circuit coupled to precharge the read bit line when performing a read, wherein the driver circuit includes circuitry to increase a voltage on the read bit line.

11. The memory device of claim 10 wherein each of the plurality of two transistor gain cells comprises:

a write transistor having a first source/drain node coupled to the write bit line and a second source/drain node coupled to a storage node; and a read transistor having a control node coupled to the storage node, a first source/drain node coupled to the read bit line, and a second source/drain node coupled to a read word line.

12. A memory device comprising:

a write bit line and a read bit line;

a P-type write transistor having a source/drain node coupled to the write bit line and a source/drain node coupled to a storage node;

a P-type read transistor having a gate node coupled to the storage node and a source/drain node coupled to the read bit line; and a write bit line driver coupled to the write bit line to provide a voltage on the storage node that creates a positive voltage between the storage node and the read bit line when writing either a "0" or a "1".

13. The memory device of claim 12 further comprising a column of memory cells, wherein each memory cell in the column includes a P-type write transistor coupled to the write bit line and a P-type read transistor coupled to the read bit line.

14. The memory device of claim 12 wherein the write bit line driver comprises circuitry to provide a voltage on the storage node that creates a voltage of greater than a threshold voltage between the storage node and the read bit line.

15. The memory device of claim 12 further comprising a driver circuit coupled to precharge the read bit line when performing a read.

16. The memory device of claim 15 wherein the driver circuit includes circuitry to reduce a voltage on the read bit line.

17. A memory device comprising:

a write bit line and a read bit line;

an N-type write transistor having a source/drain node coupled to the write bit line and a source/drain node coupled to a storage node;

a N-type read transistor having a gate node coupled to the storage node and a source/drain node coupled to the read bit line; and a write bit line driver coupled to the write bit line to provide a voltage on the storage node that creates a negative voltage between the storage node and the read bit line when writing either a "0" or a "1".

18. The memory device of claim 17 further comprising a column of memory cells, wherein each memory cell in the column includes an N-type write transistor coupled to the write bit line and an N-type read transistor coupled to the read bit line.

19. The memory device of claim 17 wherein the write bit line driver comprises circuitry to provide a voltage on the storage node that creates a voltage of greater than a threshold voltage between the read bit line and the storage node.

20. The memory device of claim 17 further comprising a driver circuit coupled to precharge the read bit line when performing a read.

21. The memory device of claim 20 wherein the driver circuit includes circuitry to increase a voltage on the read bit line.

22. An electronic system comprising:

an antenna;

a first integrated circuit coupled to the antenna; and a second integrated circuit including a memory device, the memory device comprising a plurality of two transistor gain cells arranged in a column, a write bit line and a read bit line coupled to the plurality of two transistor cells, and a driver circuit coupled to precharge the read bit line when performing a read, wherein the driver circuit includes circuitry to reduce a voltage on the read bit line.

23. The electronic system of claim 22 wherein each of the plurality of two transistor gain cells comprises isolated gate transistors.

24. The electronic system of claim 22 wherein each of the plurality of two transistor gain cells comprises:

a write transistor having a first source/drain node coupled to the write bit line and a second source/drain node coupled to a storage node; and a read transistor having a control node coupled to the storage node, a first source/drain node coupled to the read bit line, and a second source/drain node coupled to a read word line.

25. The electronic system of claim 24 wherein the write transistor and the read transistor comprise P-type isolated gate transistors.

* * * * *

UNITED STATES PATENT AND TRADEMARK OFFICE
CERTIFICATE OF CORRECTION

PATENT NO.       : 7,120,072 B2
APPLICATION NO.  : 10/881001
DATED            : October 10, 2006
INVENTOR(S)      : Ye et al.

It is certified that error appears in the above-identified patent and that said Letters Patent is hereby corrected as shown below:

On the face page, in field (56), under "U.S. Patent Documents", in column 2, line 3, below "6,072,713 A * 6/2000" insert -- US-6,747,890 06/2004 kirihata et al. 365/149 --.

In column 11, line 35, in Claim 5, delete "line." and insert -- line, and wherein the plurality of two transistor gain cells comprises a P-type isolated gate write transistor having a first source/drain node coupled to the write bit line and a second source/drain node coupled to a storage node, and a P-type isolated gate read transistor having a control node coupled to the storage node, a first source/drain node coupled to the read bit line, and a second source/drain node coupled to a read word line. --, therefor.

In column 11, lines 39–54, below "transistors." delete "7. The memory device of claim 5 wherein each of the plurality of two transistor gain cells comprises: a write transistor having a first source/drain node coupled to the write bit line and a second source/drain node coupled to a storage node; and a read transistor having a control node coupled to the storage node, a first source/drain node coupled to the read bit line, and a second source/drain node coupled to a read word line.
8. The memory device of claim 7 wherein the write transistor and the read transistor comprise P-type isolated gate transistors.
9. The memory device of claim 7 wherein the write transistor and the read transistor comprise N-type isolated gate transistors.".

In column 11, line 57, in Claim 10, delete "colunm;" and insert -- column; --, therefor.

In column 11, line 62, in Claim 10, delete "line." and insert -- line, wherein each memory cell in the column includes a P-type write transistor coupled to the write bit line and a P-type read transistor coupled to the read bit line, and wherein the write bit line driver comprises circuitry to provide a voltage on the storage node that creates a voltage of greater than a threshold voltage between the storage node and the read bit line. --, therefor.

In column 12, line 16, in Claim 12, delete ""1"." and insert -- "1"; and a column of memory cells, wherein each memory cell in the column includes a P-type write transistor coupled to the write bit line and a P-type read transistor coupled to the read bit line, and wherein the write bit line driver comprises circuitry to provide a voltage on the storage node that creates a voltage of greater than a threshold voltage between the storage node and the read bit line. --, therefor.

UNITED STATES PATENT AND TRADEMARK OFFICE
CERTIFICATE OF CORRECTION

PATENT NO. : 7,120,072 B2
APPLICATION NO. : 10/881001
DATED : October 10, 2006
INVENTOR(S) : Ye et al.

It is certified that error appears in the above-identified patent and that said Letters Patent is hereby corrected as shown below:

In column 12, lines 17–25, below ""1"." delete "13. The memory device of claim 12 further comprising a column of memory cells, wherein each memory cell in the column includes a P-type write transistor coupled to the write bit line and a P-type read transistor coupled to the read bit line.
14. The memory device of claim 12 wherein the write bit line driver comprises circuitry to provide a voltage on the storage node that creates a voltage of greater than a threshold voltage between the storage node and the read bit line.".

Signed and Sealed this

Nineteenth Day of June, 2007

JON W. DUDAS
*Director of the United States Patent and Trademark Office*